(12) United States Patent
Ren et al.

(10) Patent No.: US 10,742,067 B2
(45) Date of Patent: Aug. 11, 2020

(54) DISPLAY CART AND ITS POWER SUPPLY SYSTEM AND POWER SUPPLY METHOD

(71) Applicant: SHENZHEN VGOODE TECHNOLOGIES CO., LTD., Shenzhen (CN)

(72) Inventors: Huaide Ren, Anaheim, CA (US); Ying Zhang, Anaheim, CA (US); Yuan Huo, Anaheim, CA (US); Wentao Wang, Anaheim, CA (US)

(73) Assignee: SHENZHEN VGOODE TECHNOLOGIES CO., LTD., Shenzhen (CN)

( * ) Notice: Subject to any disclaimer, the term of this patent is extended or adjusted under 35 U.S.C. 154(b) by 203 days.

(21) Appl. No.: 16/132,232

(22) Filed: Sep. 14, 2018

(65) Prior Publication Data
US 2020/0091762 A1 Mar. 19, 2020

(51) Int. Cl.
*H02J 9/06* (2006.01)
*G01R 31/3842* (2019.01)
*B62B 3/14* (2006.01)
*H02J 7/00* (2006.01)
*H04N 5/63* (2006.01)

(52) U.S. Cl.
CPC .......... *H02J 9/062* (2013.01); *B62B 3/1424* (2013.01); *G01R 31/3842* (2019.01); *H02J 7/0047* (2013.01); *H04N 5/63* (2013.01); *H02J 7/0048* (2020.01); *H02J 9/068* (2020.01)

(58) Field of Classification Search
CPC ....................................................... H02J 9/062
See application file for complete search history.

(56) References Cited

U.S. PATENT DOCUMENTS

| | | | |
|---|---|---|---|
| 2015/0257291 A1* | 9/2015 | Yu | G06F 1/1637 361/679.08 |
| 2020/0152098 A1* | 5/2020 | Jokelainen | F16M 11/10 |

* cited by examiner

*Primary Examiner* — Daniel J Cavallari
(74) *Attorney, Agent, or Firm* — Anova Law Group, PLLC

(57) ABSTRACT

A display cart includes a pedestal, a lifting frame, and a power supply apparatus including a battery arranged within the pedestal and configured to supply power to an electric apparatus, an external power supply configured to supply power to the battery and/or the electric apparatus, and a capacity management system. The capacity management system includes a control device, a power delivery device, and a capacity statistic device. The control device determines output power of the electric apparatus. The capacity statistic device determines a remaining capacity in the battery, calculates a remaining power supply duration according to the output power of the electric apparatus, and sends a statistic result to the control device. The control device further controls the power delivery device to supply power to the electric apparatus according to the statistic result.

20 Claims, 11 Drawing Sheets

DISPLAY CART AND ITS POWER SUPPLY SYSTEM AND POWER SUPPLY METHOD

TECHNICAL FIELD OF THE PRESENT DISCLOSURE

The present disclosure relates to the technical field of mobile display apparatuses, and in particular to a display cart and its power supply apparatus and power supply method.

BACKGROUND OF THE PRESENT DISCLOSURE

With the gradual popularization of large-screen televisions, various video conferences and video display apparatuses using large-screen displays are constantly being updated. However, with the expansion of applications, many inconveniences have been found. For example, although displays can be placed in various indoor and outdoor sites such as plants, squares, lawns, roads, playgrounds, power supplies are always a problem, for example, power lines are too long to be convenient or there is no available power supply at all.

The demands for wide application of large-screen apparatuses have led to the emergence of TV carts. Many companies use such products as tools for temporary gatherings such as weddings, parties, or product publicity and display, after all video publicity can be observed dynamically, which is much better than print advertisement such as propaganda posters and leaflets. However, common TV carts in the market provide only a mechanism for holding the display and some TV carts realize limited height adjustment. Most of TV carts are used indoors and cannot supply power to displays alone. This still restricts their applications in outdoor publicity and display.

SUMMARY OF THE PRESENT DISCLOSURE

The present disclosure is aimed at solving the problems described above. An objective of the present disclosure is to provide a display cart in order to solve any one of the problems described above. Specifically, the present disclosure provides a display cart which can supply power by its own power supply, and its power supply apparatus and power supply method.

According to a first aspect of the present disclosure, the present disclosure provides a display cart, including a pedestal, a lifting frame and a power supply apparatus, wherein the lifting frame is vertically arranged on the top of the pedestal;

the power supply apparatus includes a battery, an external power supply and a capacity management system, the battery is arranged within the pedestal and used for supplying power to electric apparatuses using the display cart, and the external power supply is used for supplying power to the battery and the electric apparatuses using the display cart;

the capacity management system is used for detecting and managing capacity in the battery, and includes a control device, a power delivery device and a capacity statistic device;

the control device is used for acquiring output power of each electric apparatus currently connected to the power supply apparatus in real time and transmitting the output power to the capacity statistic device, and also used for acquiring a statistic result from the capacity statistic device in real time and controlling the power delivery device to supply power to the electric apparatuses according to the statistic result;

the capacity statistic device is used for determining remaining capacity in the battery in real time, and calculating a remaining power supply duration according to the output power of the electric apparatuses in the control device; and the power delivery device is used for starting or stopping supplying power to one or more electric apparatuses according to the control of the control device.

Wherein, priorities for supplying power to all electric apparatuses are stored in the control device; and when the statistic result from the capacity statistic device, which is acquired by the control device, indicates that the remaining capacity is less than a preset value or the remaining power supply duration is less than a preset duration, the power delivery device is controlled to sequentially stop supplying power to electric apparatuses with the lowest power supply priority according to the priorities for supplying power.

Wherein, the power delivery device includes a first power supply set and a second power supply set;

the first power supply set is used for supplying power to the electric apparatuses in real time by the battery; and the second power supply set is used for giving an alarm and stopping supplying power after a set duration when the remaining capacity is less than a set capacity.

Wherein, a rated output power value and a limited output power value are set in the control device, wherein the rated output power value is less than the limited output power value; and the control device is also used for summing up output power of each electric apparatus currently connected to the power supply apparatus, after acquiring the output power of each electric apparatus, to obtain current total output power, and comparing the current total output power with the rated output power value and the limited output power value and controlling an output of the power delivery device according to a comparison result.

Wherein, controlling the output of the power delivery device according to the comparison result includes:

when the current total output power is greater than the limited output power value, the control device controls the second power supply set to stop supplying power, continues the calculation loop for calculating the total output power after the second power supply set stops supplying power, and compares the total output power with the rated output power value; if the total output power exceeds the rated output power value, the control device controls the first power supply set to stop supplying power and gives an alarm; and when the current total output power is less than the limited output power value and greater than the rated output power value, the control device gives an alarm and controls the second power supply set to stop supplying power.

Wherein, the capacity management system further includes a display on which the remaining capacity and/or the remaining power supply duration are displayed in real time.

Wherein, the lifting frame includes a lifting post and a transmission mechanism, the lifting post is of a retractable multi-section structure and has a bottom end fixed on the top of the pedestal, and the lifting post is in transmission connection to the transmission mechanism.

Wherein, the transmission mechanism includes a hand rocker, a screw rod and a steering transmission component, the hand rocker is in transmission connection to the screw rod by the steering transmission component, and the screw rod is arranged in the lifting post and is in spiral transmission connection to the lifting post.

Wherein, the lifting frame includes a quick-assembly bar and multiple object bearing plates, the quick-assembly bar is arranged on an upright column of the lifting frame and provided with at least one row of quick-assembly holes, and one end of the object bearing plate is clamped in the quick-assembly holes.

According to another aspect of the present disclosure, the present disclosure further provides a power supply apparatus for a display cart, including a battery, an external power supply and a capacity management system; the battery is used for supplying power to electric apparatuses using the display cart, and the external power supply is used for supplying power to the battery and the electric apparatuses using the display cart;

the capacity management system is used for detecting and managing capacity in the battery, and includes a control device, a power delivery device and a capacity statistic device;

the control device is used for acquiring output power of each electric apparatus currently connected to the power supply apparatus in real time and transmitting the output power of each electric apparatus to the capacity statistic device, and also used for acquiring a statistic result from the capacity statistic device in real time and controlling the power delivery device to supply power to the electric apparatuses according to the statistic result;

the capacity statistic device is used for counting remaining capacity in the battery in real time, and calculating a remaining power supply duration according to the output power of the electric apparatuses in the control device; and the power delivery device is used for starting or stopping supplying power to one or more electric apparatuses according to the control of the control device.

Wherein, priorities for supplying power to all electric apparatuses are stored in the control device; and when the statistic result from the capacity statistic device, which is acquired by the control device, indicates that the remaining capacity is less than a preset value or the remaining power supply duration is less than a preset duration, the power delivery device is controlled to sequentially stop supplying power to electric apparatuses with the lowest power supply priority according to the priorities for supplying power.

Wherein, the power delivery device includes a first power supply set and a second power supply set, the first power supply set is used for supplying power to the electric apparatuses in real time by the battery; and the second power supply set is used for giving an alarm and stopping supplying power after a set duration when the remaining capacity is less than the set capacity.

Wherein, a rated output power value and a limited output power value are set in the control device, wherein the rated output power value is less than the limited output power value; and the control device is also used for summing up output power of each electric apparatus currently connected to the power supply apparatus, after acquiring the output power of each electric apparatus, to obtain current total output power, and comparing the current total output power with the rated output power value and the limited output power value and controlling an output of the power delivery device according to a comparison result.

Wherein, controlling the output of the power delivery device according to the comparison result includes:

when the current total output power is greater than the limited output power value, the control device controls the second power supply set to stop supplying power, continues the calculation loop for calculating the total output power after the second power supply set stops supplying power, and compares the total output power with the rated output power value; if the total output power exceeds the rated output power value, the control device controls the first power supply set to stop supplying power and gives an alarm; and when the current total output power is less than the limited output power value and greater than the rated output power value, the control device gives an alarm and controls the second power supply set to stop supplying power.

Wherein, the capacity management system further includes a display on which the remaining capacity and/or the remaining power supply duration are displayed in real time.

In addition, the present disclosure further provides a power supply method for a display cart, including: supplying power to electric apparatuses using a power supply apparatus of the display cart by a battery and/or an external power supply, supplying power to the battery by the external power supply, and detecting and managing capacity in the battery by a capacity management system;

the capacity management system includes a control device, a power delivery device and a capacity statistic device; and the control device acquires output power of each electric apparatus currently connected to the power supply apparatus in real time and transmits the output power of each electric apparatus to the capacity statistic device for calculating a remaining power supply duration in combination with remaining capacity, and then acquires a statistic result from the capacity statistic device in real time and controls the power delivery device to start or stop supplying power to one or more electric apparatuses according to the statistic result.

Wherein, priorities for supplying power to all electric apparatuses are stored in the control device; and when the statistic result from the capacity statistic device, which is acquired by the control device, indicates that the remaining capacity is less than a preset value or the remaining power supply duration is less than a preset duration, the power delivery device is controlled to sequentially stop supplying power to electric apparatuses with the lowest power supply priority according to the priorities for supplying power.

Wherein, the power delivery device includes a first power supply set and a second power supply set, the first power supply set is used for supplying power to the electric apparatuses in real time by the battery; and the second power supply set is used for giving an alarm and stopping supplying power after a set duration when the remaining capacity is less than the set capacity.

Wherein, a rated output power value and a limited output power value are set in the control device, wherein the rated output power value is less than the limited output power value; and the control device sums up output power of each electric apparatus currently connected to the power supply apparatus, after acquiring the output power of each electric apparatus, to obtain current total output power, and compares the current total output power with the rated output power value and the limited output power value and controls the output of the power delivery device according to a comparison result;

when the current total output power is greater than the limited output power value, the control device controls the second power supply set to stop supplying power, continues the calculation loop for calculating the total output power after the second power supply set stops supplying power, and compares the total output power with the rated output power value; if the total output power exceeds the rated output power value, the control device controls the first power supply set to stop supplying power and gives an alarm; and when the current total output power is less than the limited output power value and greater than the rated output power value, the control device gives an alarm and controls the second power supply set to stop supplying power.

Wherein, the capacity management system further includes a display on which the remaining capacity and/or the remaining power supply duration are displayed in real time.

In the display cart of the present disclosure, by using a double-conversion power supply apparatus which can be used for commercial power supply and can also seamlessly switch to supplying power by lithium battery cells when the commercial power supply is cut off, the "cordless" design of display carts can be realized to satisfy users' demands for use in outdoor sites without any power source, and the power supply can be automatically controlled according to the power of the electric apparatuses and the remaining capacity.

Other characteristics, features and advantages of the present disclosure will become clearer by reading the following description of exemplary embodiments with reference to the drawings.

BRIEF DESCRIPTION OF THE DRAWINGS

The drawing incorporated into the description and constituting a part of the description shows the embodiments of the present disclosure, and is used for explaining the principle of the present disclosure in combination with the description. In the drawing, similar reference numerals represent similar elements. The drawing described hereinafter shows some but not all of the embodiments of the present disclosure. A person of ordinary skill in the art can obtain other drawings according to the drawing without any creative effort.

DETAILED DESCRIPTION OF THE PRESENT DISCLOSURE

Figure 1:
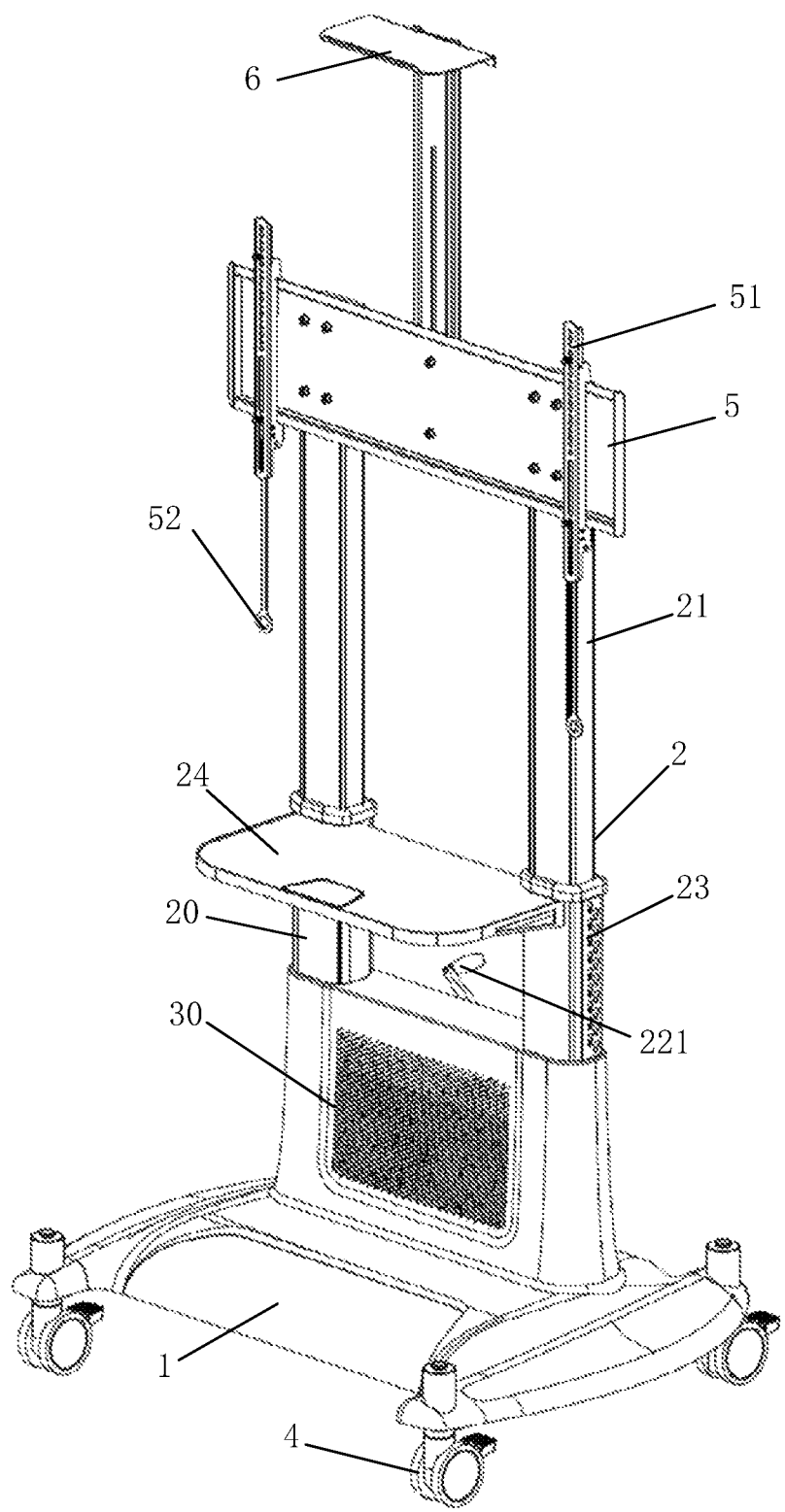
FIG. 1 exemplarily shows a structural diagram of a display cart according to the present disclosure.

To make the objectives, technical solutions and advantages of the embodiments of the present disclosure clearer, the technical solutions in the embodiments of the present disclosure will be described in conjunction with the drawing in the embodiments of the present disclosure. Apparently, the described embodiments are some but not all of the embodiments of the present disclosure. All other embodiments obtained by a person of ordinary skill in the art without any creative effort on the basis of the embodiments in the present disclosure shall fall into the scope of the present disclosure. It is to be noted that, the embodiments in the present application and the features in the embodiments can be combined at will so long as there is no conflict.

The inventors design a power supply apparatus for display carts, which can seamlessly switch between commercial power supply and supplying power by lithium battery cells. When supplying power by lithium battery cells, the power supply apparatus can control the power supply to electric apparatuses according to the power of electric apparatuses and the remaining capacity in the lithium battery cells, so that power is supplied to important electric apparatuses first. This ensures that the capacity can support the full display course, and the demands for outdoor display without external power supplies or for display when the commercial power supply is cut off are satisfied.

The display cart and its power supply apparatus and power supply method of the present disclosure will be described below in detail with reference to the drawings.

FIG. 1 shows a structural diagram of one specific embodiment of a display cart according to the present disclosure. Referring to FIG. 1, the display cart includes a pedestal 1, a lifting frame 2 and a power supply apparatus 3, wherein the lifting frame 2 is vertically arranged on the top of the pedestal 1, and a display can be fixed on the fixing frame 2. The lifting frame 2 is adjusted according to the site and display requirements, so as to adjust the position of the display.

Figure 2:
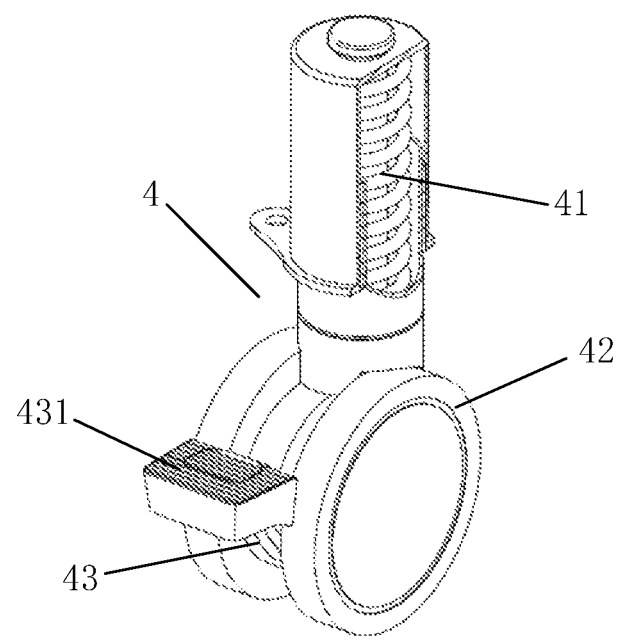
FIG. 2 exemplarily shows a structural diagram of a universal wheel according to the present disclosure.

A self-locking universal wheel 4 is provided on the bottom of the pedestal 1, so it is convenient for the movement and positioning of the display cart. FIG. 2 shows a structural diagram of a universal wheel 4 in one specific embodiment. In order to adapt to various occasions and road conditions, especially to adapt to the outdoor play occasions, the universal wheel 4 used in the present disclosure has a shockproof structure. A support structure for the universal wheel 4 is provided with a damping spring 41. The wheel body 42 is made of sliding friction material which effectively improves the outdoor travelling ability of the cart and ensures the stability during travelling, so that the display cart of the present disclosure is no longer a porcelain doll which can just move on the indoor hard ground, but can freely move on lawns, hard land and uneven lands in various indoor and outdoor environments. In addition, a self-locking brake structure 43 is provided on the universal wheel 4. Quick braking can be realized by stepping on a brake pedal 431, and when the display cart arrives at the display position, the brake structure 43 can be self-locked by stepping on the brake pedal 431, so that the display cart is fixed in position.

Figure 3:
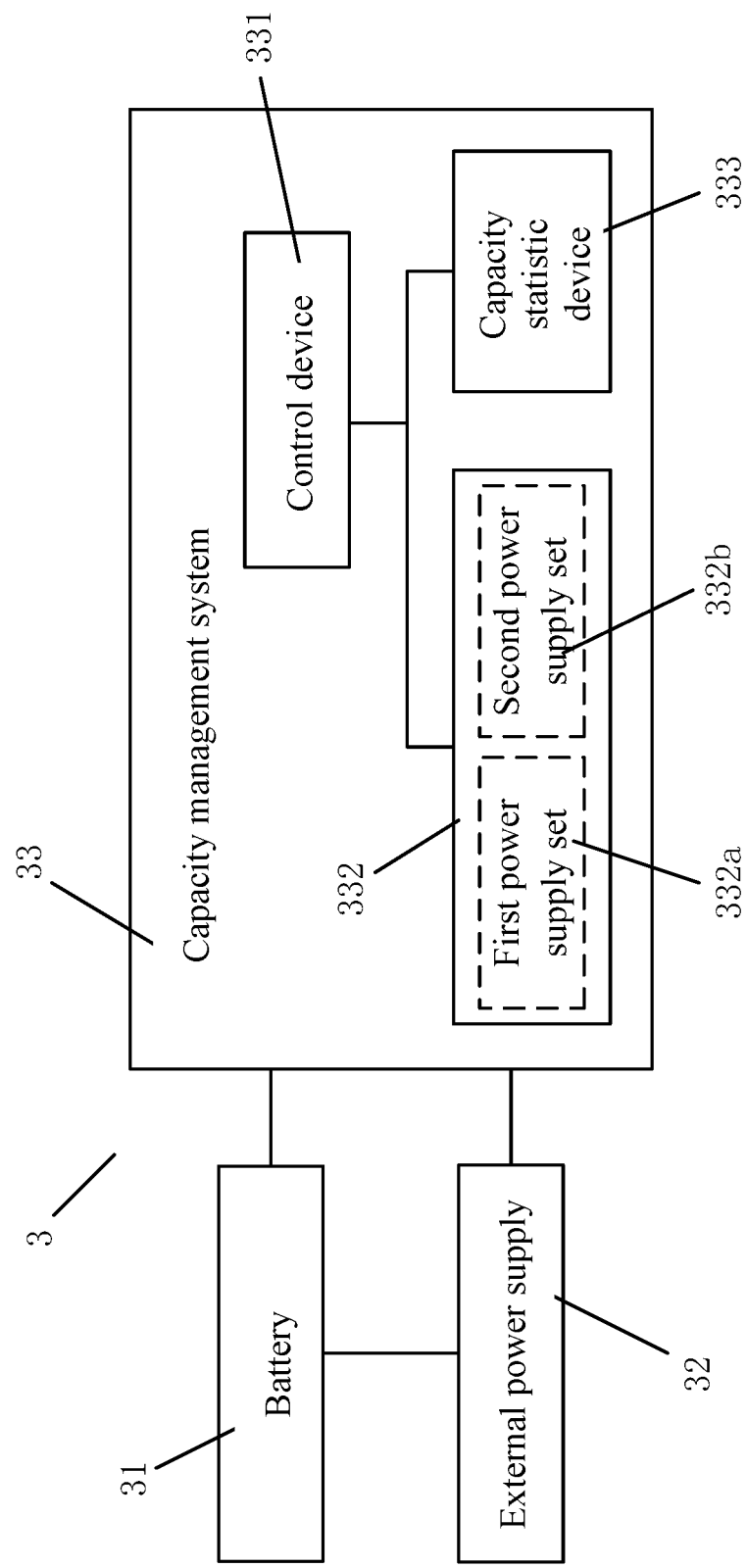
FIG. 3 exemplarily shows a structural diagram of a power supply apparatus according to the present disclosure.

FIG. 3 shows a structural diagram of a power supply apparatus 3 according to the present disclosure. Referring to FIG. 3, the power supply apparatus 3 includes a battery 31, an external power supply 32 and a capacity management system 33. In some embodiments, the battery 31 can include a lithium battery. In the product structure, the battery 31 is arranged within the pedestal 1 and used for supplying power to electric apparatuses using the display cart, and the external power supply 32 is used for supplying power to the battery 31 and the electric apparatuses using the display cart.

By using a double-conversion design in the power supply apparatus of the display cart of the present disclosure, the commercial power supply can be connected by the external power supply 32. In this way, the commercial power supply is transformed into AC power supply of constant voltage and constant frequency to provide pure power supply to loads; or the battery 31 can be used for supplying power by energy stored in the battery. Moreover, the power supply can be seamlessly switched between commercial power supply and supplying power by lithium battery cells. This will not affect the normal operation of electric apparatuses and also will not cause the loss of unsaved data or files.

Since the lithium battery cells are heavy, the battery 31 is arranged in the pedestal 1. This can effectively lower the center of gravity of the display cart and further ensure the stability of the display cart. In one embodiment, a lithium battery pack with 30 lithium battery cells of 3.2V/25 AH is used as the battery 31. The 30 lithium battery cells are divided into two groups each having 15 lithium battery cells connected in series, and then the two groups of lithium battery cells are connected in parallel. The battery management and the charge/discharge protection are performed by the capacity management system 33.

Figure 4:
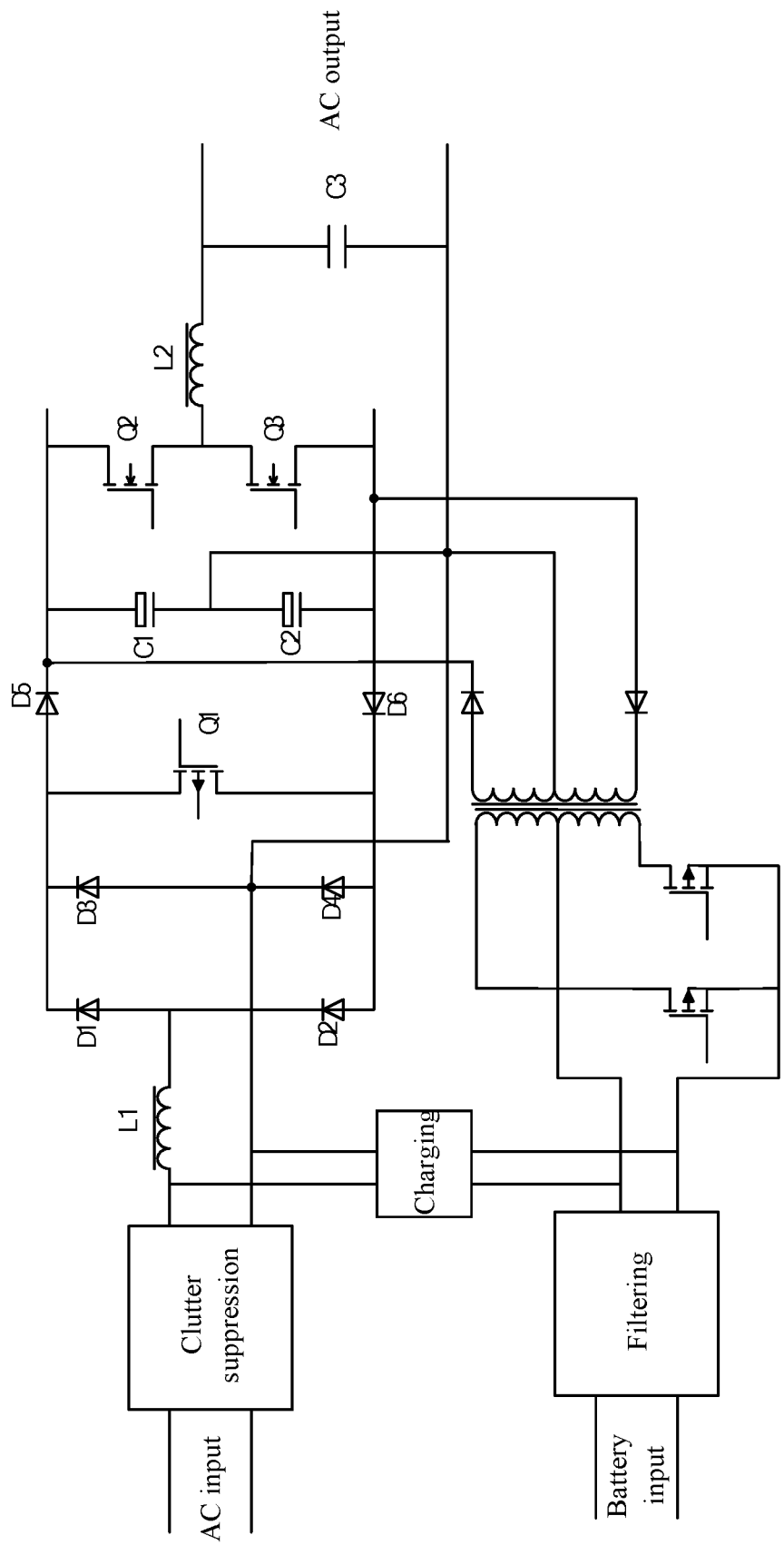
FIG. 4 exemplarily shows a topology diagram of the principle of the power supply apparatus according to the present disclosure.

FIG. 4 shows a topology diagram of the principle of a power supply apparatus in one specific embodiment of the present disclosure. The AC input of the power supply apparatus has a power factor correction circuit which can reduce current harmonics of the AC input. A wide input voltage range can be realized, and low voltage startup is realized by the rectification boost control of the PFC (Power Factor Correction) to satisfy the use in terrible power grid environment. By the design of an online circuit structure, the switching time for switching between the AC system and the battery system is not needed when the AC power is cut off and the requirements of power supply to any communication apparatuses can be satisfied. Sinusoidal inverters utilizes unipolar SPWM modulation in which less elements is required, the conversion efficiency is high and the output voltage waveform distortion is small, so it is suitable for power supply to high-precision apparatuses. The battery system and the AC system can work separately to ensure the security of supplying power by batteries.

Figure 5:
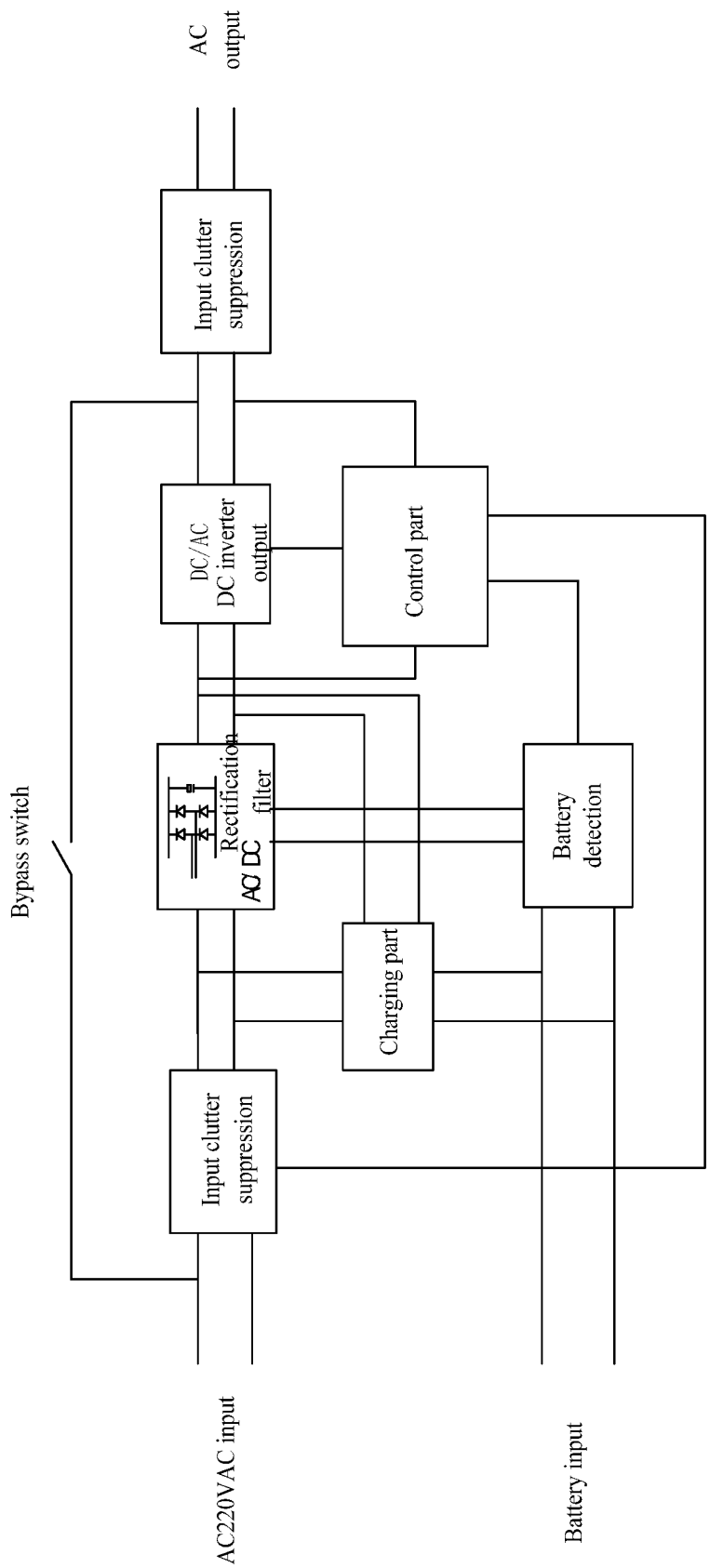
FIG. 5 exemplarily shows a block diagram of the circuit principle of the power supply apparatus according to the present disclosure.

FIG. 5 shows a block diagram of the principle of the power supply apparatus. It can be known from FIG. 4 and FIG. 5 that the commercial power of AC220V is input to the battery 31 and then divided into two branches, wherein one branch is transmitted through the bypass switch to supply power for the bypass switching of the battery 31, and the other branch can suppress most of high-frequency interference in the commercial power via clutter suppression, filtering and lightning protection. 220V AC is output to the PFC rectifier and filter circuit of AC/DC, where the AC power is rectified to DC power. The AC/DC part also accepts input from batteries, and this circuit can automatically fulfill the switching between supplying power by batteries and the commercial power supply. The output DC voltage supplies DC power to the DC/AC inverter circuit. The DC/AC circuit converts DC power into AC power of pure 50 Hz by SPWM modulation and a half-bridge inverter circuit, and finally outputs the AC power after output inductance and capacitance filtering. The charging part of the battery charges the accumulators when the commercial power supply is normal, and the detection part of the battery mainly detects functions of batteries such as low-voltage protection and overcharge protection. The control part is a core part of the self-energy-storage power supply and is mainly responsible for functions such as inversion control of the self-energy-storage power supply, overall logic switching, voltage regulation of the output AC, inversion and phase locking of the commercial power supply.

Figure 6:
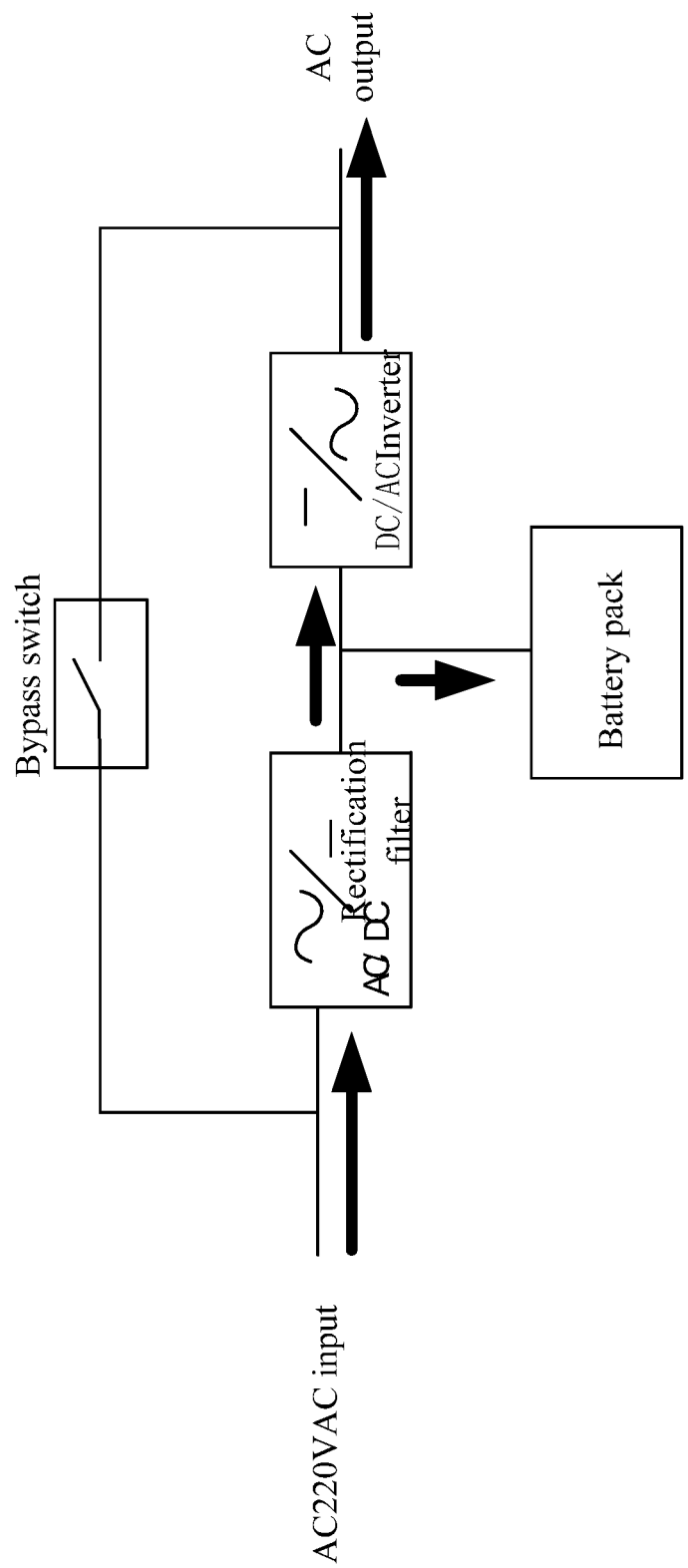
FIG. 6 exemplarily shows an energy flow diagram when commercial power supply is normal.
Figure 7:
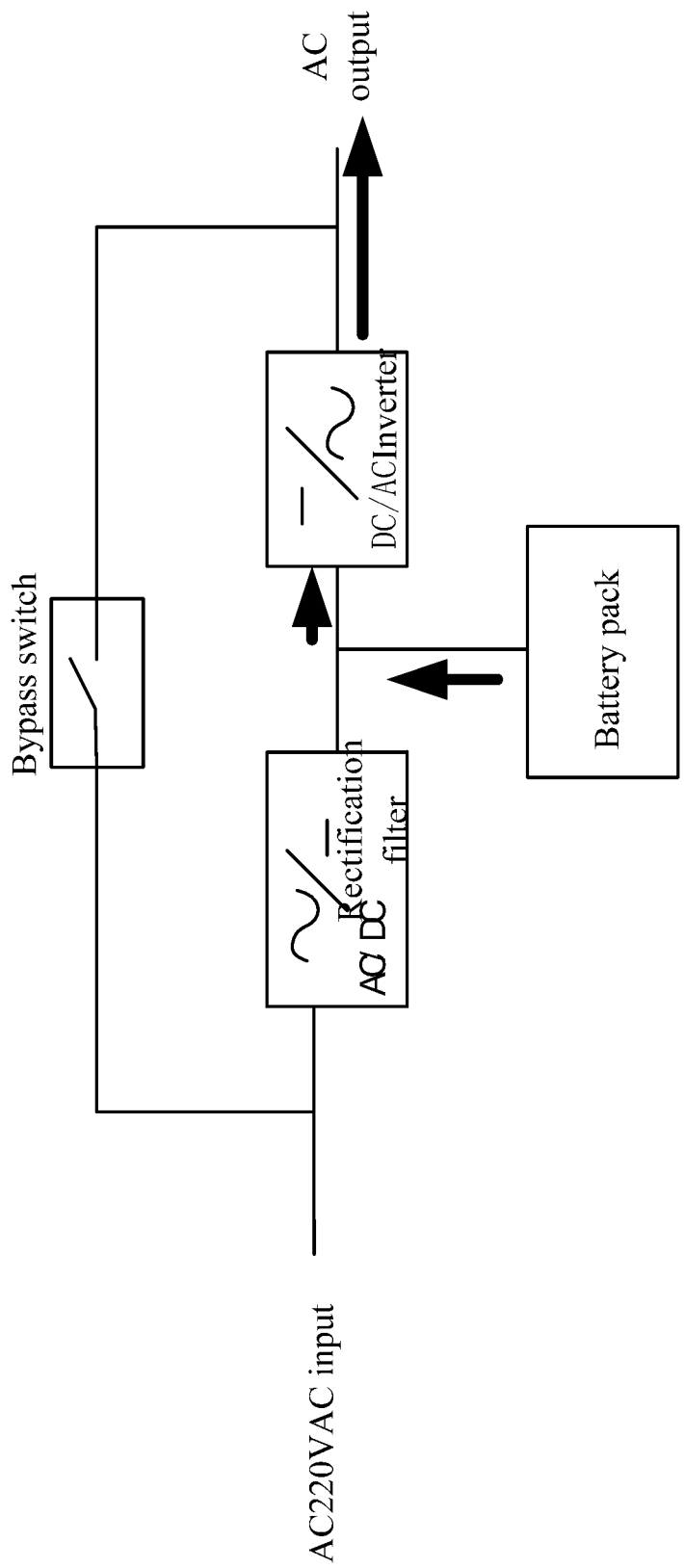
FIG. 7 exemplarily shows an energy flow diagram when the commercial power supply is cut off.
Figure 8:
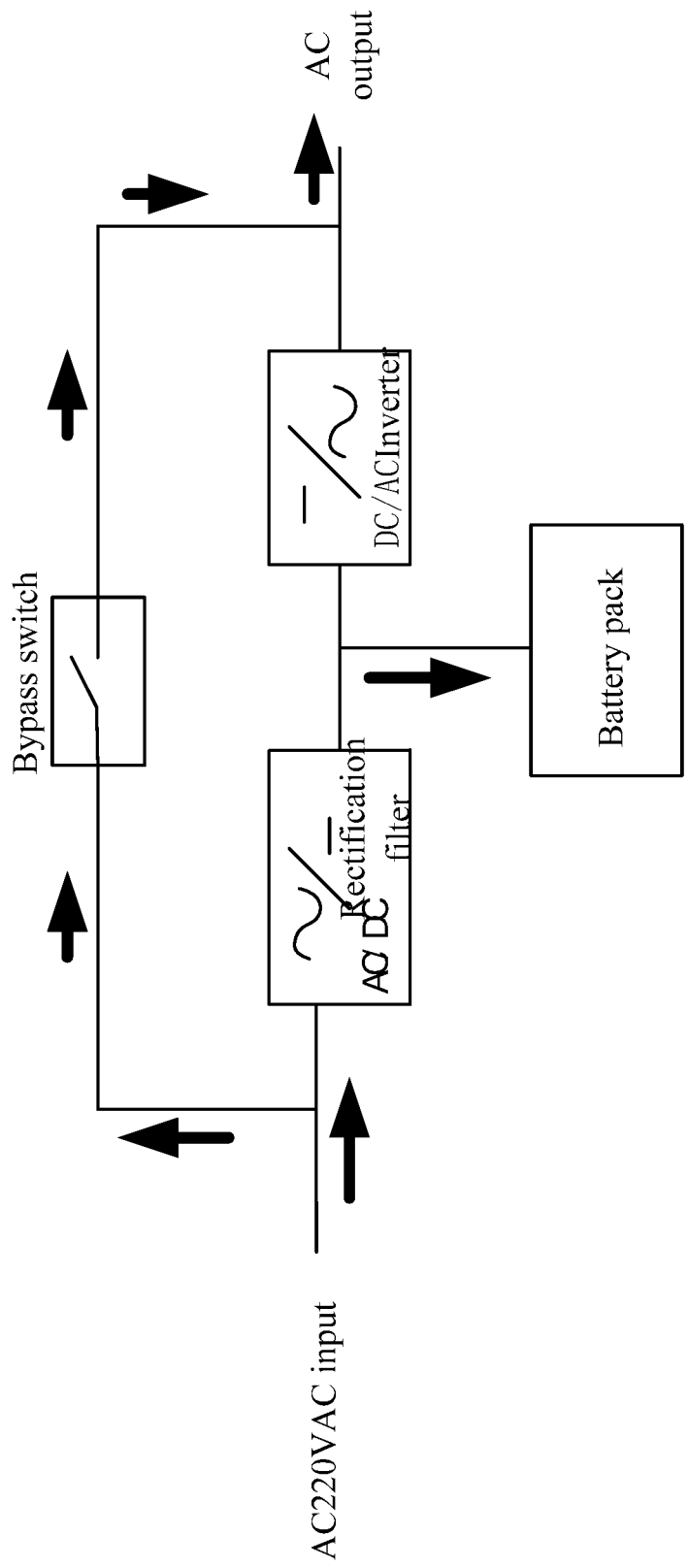
FIG. 8 exemplarily shows an energy flow diagram when a battery works in a bypass mode.

FIG. 6 shows an energy flow diagram when commercial power supply is normal, FIG. 7 is an energy flow diagram when the commercial power supply is cut off, and FIG. 8 shows an energy flow diagram when a battery works in a bypass mode. What can be known clearly and intuitively from the figures are the current trend when the commercial power supply is normal and the current trend when the commercial power supply is cut off and lithium battery cells are used to supply power in this power supply apparatus.

In the embodiment shown in FIG. 1, the power supply apparatus 3 further includes a control box 30. The control box 30 is fixed on the pedestal 1 to further lower the center of gravity of the display cart, to ensure the stability of the display cart during its traveling and use. Heat dissipation holes, which are uniformly distributed, are provided on the exterior of the control box 30, and the capacity management system 33 is arranged within the control box 30. Heat is taken away via the heat dissipation holes to effectively ensure the normal operation of electronic devices.

Returning to FIG. 3, the capacity management system 33 is used for detecting and managing capacity in the battery 31, and includes a control device 331, a power delivery device 332 and a capacity statistic device 333. Wherein, the control device 331 is used for acquiring output power of each electric apparatus currently connected to the power supply apparatus 3 in real time and transmitting the output power to the capacity statistic device 333, and also used for acquiring a statistic result from the capacity statistic device 333 in real time and controlling the power delivery device 332 to supply power to the electric apparatuses according to the statistic result; the capacity statistic device 333 is used for count remaining capacity in the battery 31 in real time, and calculating a remaining power supply duration according to the output power of the electric apparatuses in the control device 331; and the power delivery device 332 is used for starting or stopping supplying power to one or more electric apparatuses according to the control of the control device 331.

In addition, the power delivery device 332 is also used for supplementing power to the battery 31 by the external power supply 32; the capacity statistic device 333 can determine the capacity in the battery 31 in real time and feeds back it to the control device 331; and after receiving a signal indicating that the capacity is full, the control device 331 gives an alarm to prompt users, and simultaneously controls the power delivery device 332 to stop supplementing power to the battery 31. In this way, the service life of lithium battery cells is effectively extended.

In the capacity management system 33 of the present disclosure, priorities for supplying power to all electric apparatuses are stored in the control device 331. When the capacity in the lithium battery cells is not enough, power is supplied to important electric apparatuses firstly according to the power supply priorities, and power supply to less important electric apparatuses is cut off. This ensures that the remaining capacity can support the whole display course.

When the statistic result from the capacity statistic device 331, which is acquired by the control device 333, indicates that the remaining capacity is less than a preset value or the remaining power supply duration is less than a preset duration, the power delivery device 332 is controlled to sequentially stop supplying power to electric apparatuses with the lowest power supply priority according to the power supply priorities. Then, the capacity statistic device 333 again counts a remaining power supply duration after commercial power supply is cut off and feeds back the remaining power supply duration to the control device 331. If the remaining power supply duration still cannot satisfy the usage requirements, the control device 331 continues to control the power delivery device 332 to sequentially stop supplying power to electric apparatuses being used with the lowest power supply priority according to the power supply priorities, is the above steps are repeated until the remaining power supply duration counted by the capacity statistic device 333 satisfies the usage requirements.

In this embodiment, the power delivery device 332 includes a first power supply set 332a and a second power supply set 332b. Wherein, the first power supply set 332a is used for supplying power to the electric apparatuses in real time by the battery 31; and the second power supply set 332b is used for giving an alarm and stopping supplying power after a set duration when the remaining capacity is less than the set capacity. For example, the first power supply set 332a supplies power in real time when there is power in the battery 31 and there are electric apparatuses connected thereto. When the remaining capacity in the lithium battery cells is less than 20% (which can be set by selection or input according to the actual situation), the second power supply set 332b directly gives an alarm, or feeds back this case to the control device 331 which then gives an alarm, and simultaneously stops supplying power to some or all of electric apparatuses connected to the second power supply set 332b after 2 minutes (which can be set by selection or input according to the actual situation, for example, it can also be set to 1.5 minutes, 3 minutes or 5 minutes). Preferably, according to the power supply priorities in the control device 331, the second power supply set 332b stops supplying power to less important electric apparatuses firstly.

The display of the capacity in percentage is not intuitive enough. Particularly, since the power capacities in the batteries for display carts of different models are different and the powers of different electric apparatuses are different, the durations of the capacities with the same percentage are different. The capacity management system 33 of the present disclosure combines the remaining capacity in the lithium battery cells and the power of current electric apparatuses to calculate the duration of the current capacity and displays the duration in, for example, minutes. In this way, the capacity can be more intuitive and it is more meaningful for users. Whenever users increase or reduce the number of the electric apparatuses, the remaining duration will accordingly change in real time according to the statistic result.

Specifically, a rated output power value and a limited output power value are set in the control device 331. That is, the rated total output power and the maximum output power of the power supply apparatus 3 can be simultaneously used, wherein the rated output power value is less than the limited output power value.

The control device 331 is also used for summing up output power of each electric apparatus currently connected to the power supply apparatus 3, after acquiring the output power of each electric apparatus, to obtain a current total output power, and comparing the current total output power with the rated output power value and the limited output power value and controlling the output of the power delivery device 332 according to a comparison result.

In a typical embodiment, the controlling the output of the power delivery device 332 according to the comparison result can include: when the current total output power is greater than the limited output power value, by the control device 331, controlling the second power supply set 332b to stop supplying power, continuing the calculation loop for calculating the total output power after the second power supply set 332b stops supplying power and comparing the calculated total output power with the rated output power value; and if the calculated total output power exceeds the rated output power value, by the control device 331, controlling the first power supply set 332a to stop supplying power and giving an alarm. When the current total output power is less than the limited output power value and greater than the rated output power value, the control device 331 gives an alarm and controls the second power supply set 332b to stop supplying power.

It is to be noted that the capacity management system 33 of the present disclosure further includes a display (not shown) in which the remaining capacity and/or the remaining power supply duration are displayed on the display in real time, it is convenient for the users or the operators to intuitively learn about the remaining capacity in lithium battery cells and effectively control the use of the remaining capacity. This ensures that the capacity can support the whole display course.

In the hardware construction of the display cart of the present disclosure, a lifting frame 2 is provided on the pedestal 1, and a display mount 5 is provided on the top of the lifting frame 2. The display mount 5 can be lifted or descended by the lifting or descending of the lifting frame 2, and thus the height of the display is adjusted. Specifically, the lifting frame 2 includes a lifting post 21 and a transmission mechanism 22, the lifting post 21 is of a retractable multi-section structure and has a bottom end fixed on the top of the pedestal 1, and the lifting post 21 is in transmission connection to the transmission mechanism 22.

In the embodiment shown in FIG. 1, the lifting or descending of the lifting frame 2 is operated manually. The transmission mechanism 22 includes a hand rocker 221, a screw rod 222 and a steering transmission component 223, the hand rocker 221 is in transmission connection to the screw rod 222 by the steering transmission component 223, and the screw rod 222 is arranged in the lifting post 21 and is in spiral transmission connection to the lifting post 21. The hand rocker 221 is rotated by hands, and the rotation of changing direction by 90° is realized by the steering transmission component 223, to drive the threaded transmission between the screw rod 222 and the lifting post 21 can be realized. The lifting or descending of the lifting post 21 is realized, which drives the display mount 5 to lift or descend. In this way, the height of the display is adjusted.

Figure 9:
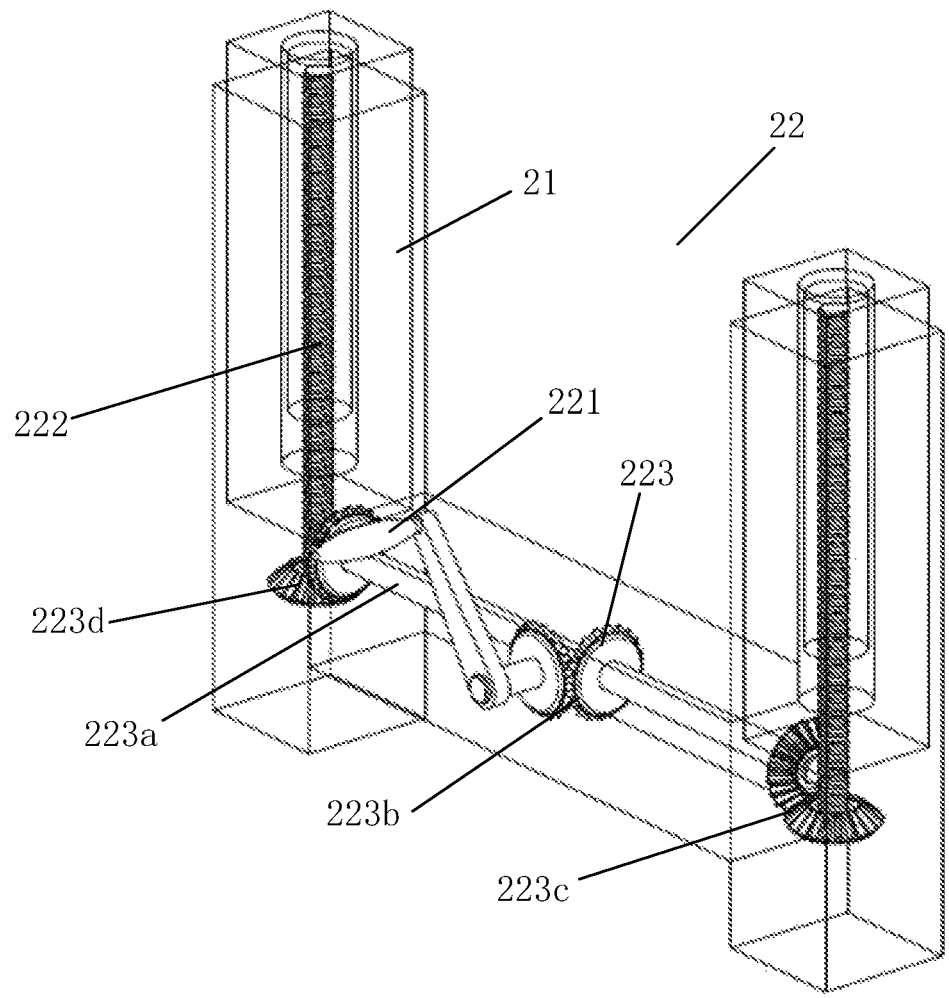
FIG. 9 exemplarily shows a structural diagram of a transmission mechanism according to the present disclosure.

FIG. 9 shows a structural diagram of one specific embodiment of a transmission mechanism 22. In this embodiment, in order to ensure the stable lifting or descending of the lifting frame 2, one screw rod 222 is provided in each of two lifting posts 21 to synchronously control the two lifting posts 21 to lift or descend simultaneously. Specifically, the screw direction of two screw rods 222 can be the same or opposite, depending on the transmission structure of the steering transmission component 223.

In this embodiment, the switching between transmission directions is realized mainly by a bevel gear set. The screw directions of the two screw rods 222 are opposite, one having right-hand threads and the other having left-hand threads. Specifically, the steering transmission component 223 includes a spindle 223a, a first bevel gear set 223b, a second bevel gear set 223c and a third bevel gear set 223d, wherein one bevel gear in the first bevel gear set 223b is fixedly connected to the hand rocker 221 and the other bevel gear is fixed in the middle of the spindle 223a. When the hand rocker 221 is rotated manually, the spindle 223a rotates around its central shaft by the engaged transmission in the first bevel gear set 223b. One bevel gear in the second bevel gear set 223c and one bevel gear in the third bevel gear set 223d are respectively fixed to two ends of the spindle 223a, and the other bevel gear in the second bevel gear set 223c and the other bevel gear in the third bevel gear set 223d are fixedly connected to bottom ends of the two screw rods 222, respectively. When the hand rocker 221 is rotated manually, the spindle 223a is driven to rotate by the first bevel gear set 223b, and the spindle 223a drives the two screw rods 22 to rotate by means of the second bevel gear set 223c and the third bevel gear set 223d. Thus, the lifting posts 21 drive the display mount 5 to lift or descend.

In this embodiment, the lifting frame 2 is mainly lifted or descended manually, and in another embodiment, the lifting frame 2 can be electrically controlled by apparatuses such as motors. The screw rod 222 can be a common screw rod, or alternatively, can be a ball screw; and the transmission structure can utilize a worm and gear structure to realize the steering transmission, and can also utilize transmission structures such as belts or chains to drive the screw rod 222 to rotate, thus to realize the lifting or descending of the lifting frame 2.

Figure 10:
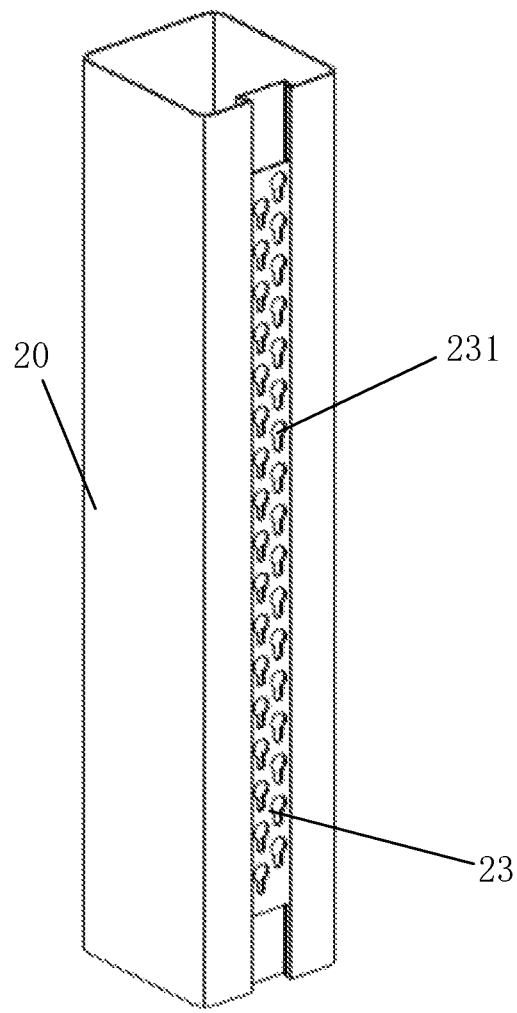
FIG. 10 exemplarily shows a structural diagram of a quick-assembly bar according to the present disclosure.
Figure 11:
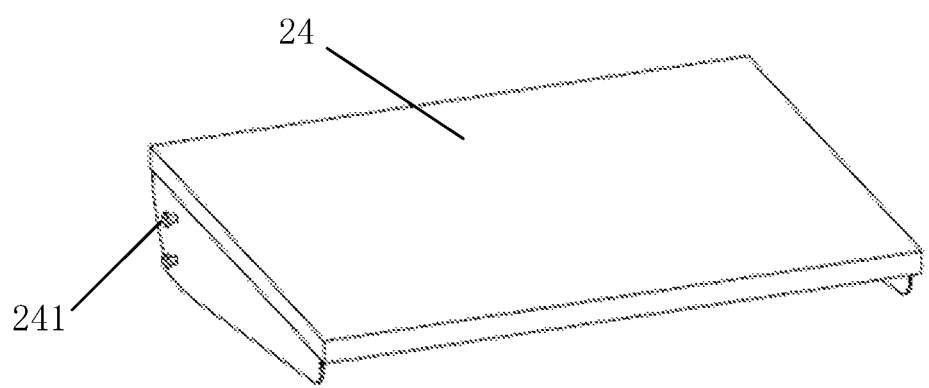
FIG. 11 exemplarily shows a structural diagram of an object bearing plate according to the present disclosure.

In addition, the lifting frame 2 further includes a quick-assembly bar 23 and multiple object bearing plates 24. FIG. 10 shows a mounting structure diagram of a quick-assembly bar according to one specific embodiment, and FIG. 11 shows a structural diagram of an object bearing plate 24 according to one embodiment. Specifically, the quick-assembly bar 23 is arranged on an upright column 20 of the lifting frame 2 and provided with at least one row of quick-assembly holes 231, and one end of the object bearing plates 24 is clamped in the quick-assembly hole 231. The quick-assembly holes 231 can be inverted-calabash-shaped holes, or can be any holes which are convenient for clamping, such as, oblong holes, kidney-shaped holes, square holes and elongated holes with toothed sides. During the use, various accessories can be placed on the object bearing plates 24, for example, speaker boxes, notebook computer holders, tool cases, and storage boxes.

The upright column 20 is arranged on the pedestal 1 and wrapped outside the lifting post 21 to provide preliminary support for the lifting frame 2. Meanwhile, the quick-assembly bar 23 can be clamped in the upright column 20 to fix the object bearing plate 24. In the embodiment shown in FIG. 11, a T-shaped groove, which runs longitudinally, is formed on a sidewall of the upright column 20, and the quick-assembly bar 23 is clamped in the T-shaped groove in such a way that it can slide therein.

Specifically, the display mount 5 includes a locking frame 51 and an unlocking ring 52. The locking frame 51 is used for mounting and fixing the display, and when the display is to be disassembled, the unlocking ring 52 can be pulled downward to unlock the display.

In the embodiment shown in FIG. 1, a bracket 6 is provided on the top of the display mount 5, on which cameras, lighting apparatuses or the like can be placed.

In another aspect, the present disclosure further provides a power supply apparatus 3 for a display cart. Returning to FIG. 3, the power supply apparatus 3 includes a battery 31, an external power supply 32 and a capacity management system 33. Wherein, the battery 31 is used for supplying power to electric apparatuses using the display cart, and the external power supply 32 is used for supplying power to the battery 31 and the electric apparatuses using the display cart.

By using a double-conversion design in the power supply apparatus, the commercial power supply can be connected by the external power supply 32. In this way, the commercial power supply is transformed into AC power supply of constant voltage and constant frequency, to provide pure power supply to loads; or the battery 31 can also be used for supplying power by energy stored in the battery. Moreover, power supply can be seamlessly switched between commercial power supply and supplying power by lithium battery cells. This will not affect the normal operation of electric apparatuses and also will not cause the loss of unsaved data or files.

In this embodiment, the capacity management system 33 is used for detecting and managing capacity in the battery 31, and includes a control device 331, a power delivery device 332 and a capacity statistic device 333. Wherein, the control device 331 is used for acquiring output power of each electric apparatus currently connected to the power supply apparatus 3 in real time and transmitting the acquired output power to the capacity statistic device 333, and also used for acquiring a statistic result from the capacity statistic device 333 in real time and controlling the power delivery device 332 to supply power to the electric apparatuses according to the statistic result; the capacity statistic device 333 is used for counting remaining capacity in the battery 31 in real time, and calculating a remaining power supply duration according to the output power of the electric apparatuses in the control device 331; and the power delivery device 332 is used for starting or stopping supplying power to one or more electric apparatuses according to the control of the control device 331.

The power delivery device 332 is also used for connecting to the external power supply 32 for supplementing power to the battery 31; the capacity statistic device 333 counts the capacity in the battery 31 in real time and feeds it back to the control device 331; and when receiving a capacity signal sent by the capacity statistic device 333 and determining that the capacity is full, the control device 331 gives an alarm to prompt users, and simultaneously controls the power delivery device 332 to disconnect from the external power supply 32 or the battery 31 to stop supplementing power to the battery 31. In this way, the service life of lithium battery cells is effectively extended.

Priorities for supplying power to all electric apparatuses are stored in the control device 331. When the capacity in the lithium battery cells is not enough to supply power to all electric apparatuses for their desired durations, the control device 331 can control the power delivery device 332 to continue supplying power to electric apparatuses with high power supply priority and stop supplying power to electric apparatuses with low power supply priority according to the power supply priorities, to prolong the power supply duration. This ensures that the remaining capacity can support the whole display course of the main display task.

Specifically, when the statistic result from the capacity statistic device 331, which is acquired by the control device 333, indicates that the remaining capacity is less than a preset value or the remaining power supply duration is less than a preset duration, the power delivery device 332 is controlled to sequentially stop supplying power to electric apparatuses with the lowest power supply priority according to the power supply priorities. Then, the capacity statistic device 333 again counts a remaining power supply duration after power supply is stopped and feeds back the remaining power supply duration to the control device 331. If the remaining power supply duration still cannot satisfy the usage requirements, the control device 331 continues to control the power delivery device 332 to sequentially stop supplying power to electric apparatuses being used with the lowest power supply priority according to the power supply priorities. The above steps are repeated until the remaining power supply duration counted by the capacity statistic device 333 satisfies the usage requirements.

In a specific embodiment, the power delivery device 332 includes a first power supply set 332a and a second power supply set 332b, the first power supply set 332a is used for supplying power to the electric apparatuses in real time by the battery 31; and the second power supply set 332b is used for giving an alarm and stopping supplying power after a set duration when the remaining capacity is less than the set capacity.

In addition, a rated output power value and a limited output power value are set in the control device 331, wherein the rated output power value is less than the limited output power value. The control device 331 is also used for summing up output power of each electric apparatus currently connected to the power supply apparatus 3, after acquiring the output power of each electric apparatus, to obtain current total output power, and comparing the current total output power with the rated output power value and the limited output power value, and controlling the output of the power delivery device 332 according to a comparison result.

Wherein, controlling the output of the power delivery device 332 according to the comparison result includes: when the current total output power is greater than the limited output power value, by the control device 331, controlling the second power supply set 332b to stop supplying power, continuing the calculation loop for calculating the total output power after the second power supply set 332b stops supplying power and comparing the total output power with the rated output power value; and if the total output power exceeds the rated output power value, by the control device 331, controlling the first power supply set 332a to stop supplying power and giving an alarm; and when the current total output power is less than the limited output power value and greater than the rated output power value, by the control device 331, giving an alarm and controlling the second power supply set 332b to stop supplying power.

In a typical embodiment, the capacity management system 33 further includes a display on which the remaining capacity and/or the remaining power supply duration are displayed in real time, and it is convenient for users to control the power consumption of electric apparatuses according to actual requirements.

Corresponding to the power supply apparatus, the present disclosure further provides a power supply method for a display cart, including: supplying power to electric apparatuses using a power supply apparatus 3 of the display cart by a battery 31 and/or an external power supply 32, supplying power to the battery 31 by the external power supply 32, and detecting and managing capacity in the battery 31 by a capacity management system 33.

The capacity management system 33 includes a control device 331, a power delivery device 332 and a capacity statistic device 333.

The method for detecting and managing the capacity in the battery 31 by the capacity management system 33 includes: by the control device 331, acquiring output power of each electric apparatus currently connected to the power supply apparatus 3 in real time and transmitting the output power to the capacity statistic device 333 for calculating a remaining power supply duration in combination with remaining capacity; and then acquiring a statistic result from the capacity statistic device 333 in real time and controlling the power delivery device 332 to start or stop supplying power to one or more electric apparatuses according to the statistic result.

Specifically, priorities for supplying power to all electric apparatuses are stored in the control device 331. When the statistic result from the capacity statistic device 331, which is acquired by the control device 333, indicates that the remaining capacity is less than a preset value or the remaining power supply duration is less than a preset duration, the power delivery device 332 is controlled to sequentially stop supplying power to electric apparatuses with the lowest power supply priority according to the power supply priorities.

Wherein, the power delivery device 332 includes a first power supply set 332a and a second power supply set 332b, the first power supply set 332a is used for supplying power to the electric apparatuses in real time by the battery 31; and the second power supply set 332b is used for giving an alarm and stopping supplying power after a set duration when the remaining capacity is less than the set capacity.

It is to be noted that a rated output power value and a limited output power value are set in the control device 331, wherein the rated output power value is less than the limited output power value;

the control device 331 sums up output power of each electric apparatus currently connected to the power supply apparatus 3, after acquiring the output power of each electric apparatus, to obtain current total output power, and compares the current total output power with the rated output power value and the limited output power value and controls the output of the power delivery device 332 according to a comparison result;

when the current total output power is greater than the limited output power value, the control device 331 controls the second power supply set 332b to stop supplying power, continues the calculation loop for calculating the total output power after the second power supply set 332b stops supplying power, and compares the total output power with the rated output power value; if the total output power exceeds the rated output power value, the control device 331 controls the first power supply set 332a to stop supplying power and gives an alarm; and when the current total output power is less than the limited output power value and greater than the rated output power value, the control device 331 gives an alarm and controls the second power supply set 332b to stop supplying power.

The contents described above can be implemented independently or jointly in various ways, and these transformations shall fall into the protection scope of the present disclosure.

It is to be noted that, as used herein, the relational terms such as "first" and "second" are merely used for distinguishing one entity or operation from another entity or operation, but do not necessarily require or imply any actual relationship or order between entities or operations. Moreover, the term "comprise/comprising," "contain/containing" or any other variants thereof is non-exclusive, so that a process, method, object or device containing a series of elements contains not only these elements, but also other elements not listed clearly, or further contains inherent elements of the process, method, object or device. Without more restrictions, an element defined by the statement "comprises an/a . . . " does not exclude other identical elements in the process, method, object or device including this element.

Finally, it is to be noted that the foregoing embodiments are merely used for describing the technical solutions of the present disclosure and not intended to limit the technical solutions of the present disclosure. Although the present disclosure has been described in detail with the foregoing embodiments, it should be understood by a person of ordinary skill in the art that modifications still can be made to the technical solutions described in the foregoing embodiments or equivalent replacements can be made to part of technical features, and these modifications or replacements will not make the essence of the corresponding technical solutions depart from the spirit and scope of the technical solutions in the embodiments of the present disclosure.

The invention claimed is:

1. A display cart comprising:
a pedestal;
a lifting frame vertically arranged on a top of the pedestal; and
a power supply apparatus including:
  a battery arranged within the pedestal and configured to supply power to an electric apparatus mounted at the display cart;
  an external power supply configured to supply power to at least one of the battery or the electric apparatus; and
  a capacity management system including a control device, a power delivery device, and a capacity statistic device, wherein:
    the control device is configured to determine output power of the electric apparatus;
    the capacity statistic device is configured to determine a remaining capacity in the battery, calculate a remaining power supply duration according to the output power of the electric apparatus, and send a statistic result indicating the remaining capacity and the remaining power supply duration to the control device;
    the control device is further configured to control the power delivery device to supply power to the electric apparatus according to the statistic result; and
    the power delivery device is configured to start or stop supplying power to the electric apparatus under control of the control device.

2. The display cart according to claim 1, wherein:
the electric apparatus is one of a plurality of electric apparatuses mounted at the display cart and coupled to the power supply apparatus;
the control device stores priorities for supplying power to the plurality of electric apparatuses; and
the control device is further configured to, in response to the statistic result indicating that the remaining capacity is less than a preset value or the remaining power supply duration is less than a preset duration, control the power delivery device to sequentially stop supplying power to the plurality of electric apparatuses according to the priorities.

3. The display cart according to claim 1, wherein the power delivery device includes:
a first power supply set configured to deliver power from the battery to the electric apparatus; and
a second power supply set configured to send an alarm and stop supplying power after a set duration in response to the remaining capacity being less than a set capacity.

4. The display cart according to claim 3, wherein:
the electric apparatus is one of a plurality of electric apparatuses mounted at the display cart and coupled to the power supply apparatus; and
the control device is further configured to:
  sum up output powers of the plurality of electric apparatus to obtain a total output power;
  compare the total output power with a rated output power value and a limited output power value to obtain a comparison result, the rated output power value being less than the limited output power value; and
  control an output of the power delivery device according to the comparison result.

5. The display cart according to claim 4, wherein the control device is further configured to control the output of the power delivery device according to the comparison result by:
in response to the total output power being greater than the limited output power value:
  controlling the second power supply set to stop supplying power; and
  after the second power supply set stops supplying power:
    calculating again the total output power;
    comparing the total output power with the rated output power value; and
    in response to the total output power exceeding the rated output power value, controlling the first power supply set to stop supplying power and to send an alarm; and
in response to the total output power being less than the limited output power value and greater than the rated output power value, sending an alarm and controlling the second power supply set to stop supplying power.

6. The display cart according to claim 1, wherein the capacity management system further includes a display configured to display the remaining capacity and/or the remaining power supply duration.

7. The display cart according to claim 1, wherein the lifting frame includes:
a lifting post including a retractable multi-section structure and having a bottom end fixed on the top of the pedestal;
a transmission mechanism; and
a lifting post in transmission connection with the transmission mechanism.

8. The display cart according to claim 7, wherein the transmission mechanism includes:
a screw rod arranged in the lifting post and being in spiral transmission connection with the lifting post;
a steering transmission component; and
a hand rocker in transmission connection with the screw rod by the steering transmission component.

9. The display cart according to claim 1, wherein the lifting frame includes:

an upright column;
a quick-assembly bar arranged on the upright column and including at least one row of quick-assembly holes; and
an object bearing plate, one end of the object bearing plate being clamped in the quick-assembly holes.

10. A power supply apparatus for a display cart comprising:
a battery configured to supply power to an electric apparatus mounted at the display cart;
an external power supply configured to supply power to at least one of the battery or the electric apparatus; and
a capacity management system including a control device, a power delivery device, and a capacity statistic device, wherein:
the control device is configured to determine output power of the electric apparatus;
the capacity statistic device is configured to determine a remaining capacity in the battery, calculate a remaining power supply duration according to the output power of the electric apparatus, and send a statistic result indicating the remaining capacity and the remaining power supply duration to the control device;
the control device is further configured to control the power delivery device to supply power to the electric apparatus according to the statistic result; and
the power delivery device is configured to start or stop supplying power to the electric apparatus under control of the control device.

11. The power supply apparatus according to claim 10, wherein:
the electric apparatus is one of a plurality of electric apparatuses mounted at the display cart and coupled to the power supply apparatus;
the control device stores priorities for supplying power to the plurality of electric apparatuses; and
the control device is further configured to, in response to the statistic result indicating that the remaining capacity is less than a preset value or the remaining power supply duration is less than a preset duration, control the power delivery device to sequentially stop supplying power to the plurality of electric apparatuses according to the priorities.

12. The power supply apparatus according to claim 10, wherein the power delivery device includes:
a first power supply set configured to deliver power from the battery to the electric apparatus; and
a second power supply set configured to send an alarm and stop supplying power after a set duration in response to the remaining capacity being less than a set capacity.

13. The power supply apparatus according to claim 12, wherein:
the electric apparatus is one of a plurality of electric apparatuses coupled to the power supply apparatus; and
the control device is further configured to:
sum up output powers of the plurality of electric apparatus to obtain a total output power;
compare the total output power with a rated output power value and a limited output power value to obtain a comparison result, the rated output power value being less than the limited output power value; and
control an output of the power delivery device according to the comparison result.

14. The power supply apparatus according to claim 13, wherein the control device is further configured to control the output of the power delivery device according to the comparison result by:
in response to the total output power being greater than the limited output power value:
controlling the second power supply set to stop supplying power; and
after the second power supply set stops supplying power:
calculating again the total output power;
comparing the total output power with the rated output power value; and
in response to the total output power exceeding the rated output power value, controlling the first power supply set to stop supplying power and to send an alarm; and
in response to the total output power being less than the limited output power value and greater than the rated output power value, sending an alarm and controlling the second power supply set to stop supplying power.

15. The power supply apparatus according to claim 10, wherein the capacity management system further includes a display configured to display the remaining capacity and/or the remaining power supply duration.

16. A power supply method for a display cart comprising:
supplying power to an electric apparatus using a power supply apparatus of the display cart by a battery and/or an external power supply;
supplying power to the battery by the external power supply; and
detecting and managing, by a capacity management system, capacity in the battery, including:
determining, by a control device of the capacity management system, output power of the electric apparatus;
determining, by a capacity statistic device of the capacity management system based on the output power of the electric apparatus, a statistic result including a remaining power supply duration and a remaining capacity in the battery; and
controlling, by the control device, a power delivery device of the capacity management system to start or stop supplying power to the electric apparatus according to the statistic result.

17. The power supply method according to claim 16, wherein:
the electric apparatus is one of a plurality of electric apparatuses coupled to the power supply apparatus;
the control device stores priorities for supplying power to the plurality of electric apparatuses; and
detecting and managing the capacity in the battery further includes, in response to the statistic result indicating that the remaining capacity is less than a preset value or the remaining power supply duration is less than a preset duration, controlling the power delivery device to sequentially stop supplying power to the plurality of electric apparatuses according to the priorities.

18. The power supply method according to claim 16, wherein the power delivery device includes:
a first power supply set configured to deliver power from the battery to the electric apparatus; and
a second power supply set configured to send an alarm and stop supplying power after a set duration in response to the remaining capacity being less than a set capacity.

19. The power supply method according to claim 18, wherein:
  the electric apparatus is one of a plurality of electric apparatuses coupled to the power supply apparatus; and
  detecting and managing the capacity in the battery further includes:
    summing up output powers of the plurality of electric apparatus to obtain a total output power;
    comparing the total output power with a rated output power value and a limited output power value to obtain a comparison result, the rated output power value being less than the limited output power value; and
    controlling an output of the power delivery device according to the comparison result, including:
      in response to the total output power being greater than the limited output power value:
        controlling the second power supply set to stop supplying power; and
        after the second power supply set stops supplying power:
          calculating again the total output power;
          comparing the total output power with the rated output power value; and
          in response to the total output power exceeding the rated output power value, controlling the first power supply set to stop supplying power and to send an alarm; and
      in response to the total output power being less than the limited output power value and greater than the rated output power value, sending an alarm and controlling the second power supply set to stop supplying power.

20. The power supply method according to claim 16, further comprising:
  displaying the remaining capacity and/or the remaining power supply duration on a display.

* * * * *